(12) United States Patent
Pond et al.

(10) Patent No.: US 11,183,756 B1
(45) Date of Patent: Nov. 23, 2021

(54) DISTRIBUTED POWER SUPPLY SYSTEM FOR PHASED ARRAYS

(71) Applicant: Rockwell Collins, Inc., Cedar Rapids, IA (US)

(72) Inventors: Robert D. Pond, Cedar Rapids, IA (US); James B. Mayfield, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 483 days.

(21) Appl. No.: 16/141,205

(22) Filed: Sep. 25, 2018

(51) Int. Cl.
  *H01Q 3/26* (2006.01)
  *H05K 1/02* (2006.01)
  *H04W 52/04* (2009.01)
  *H04B 7/0426* (2017.01)
  *G01S 7/03* (2006.01)

(52) U.S. Cl.
  CPC ............ *H01Q 3/26* (2013.01); *H04B 7/0426* (2013.01); *H04W 52/04* (2013.01); *H05K 1/0243* (2013.01); *G01S 7/03* (2013.01)

(58) Field of Classification Search
  CPC .................................. H01Q 3/26; G01S 7/03
  USPC .................................................. 342/175, 62
  See application file for complete search history.

(56) References Cited

U.S. PATENT DOCUMENTS

2018/0115066 A1* 4/2018 Jain .................. H01P 3/026

OTHER PUBLICATIONS

U.S. Appl. No. 15/600,497, filed Mar. 19, 2017, Paulsen et al.
U.S. Appl. No. 15/697,262, filed Sep. 6, 2017, West et al.

* cited by examiner

*Primary Examiner* — Bo Fan
(74) *Attorney, Agent, or Firm* — Suiter Swantz pc llo

(57) ABSTRACT

A phased array system includes an antenna system includes multiple antennas configured to transmit or receive signals and a power supply circuit configured to generate a supply power and provide the supply power to a plurality of distributed power supply circuits. The phased array system includes distributed power supply circuits, each of the plurality of distributed power supply circuits configured to receive the supply power from the power supply circuit and generate radio frequency supply powers for one multiple radio frequency circuits. The phased array system includes radio frequency circuits, each of the radio frequency circuits configured to cause one of the antennas to transmit or receive the signals based on the plurality of radio frequency supply powers.

20 Claims, 8 Drawing Sheets

DISTRIBUTED POWER SUPPLY SYSTEM FOR PHASED ARRAYS

BACKGROUND

Embodiments of the inventive concepts disclosed herein relate generally to the field of phased array systems. More particularly, embodiments of the inventive concepts disclosed herein relate to power supply systems for phased array systems.

A phased array system is a computer-controlled array of antennas which generate a beam of radio waves which can be electronically steered in a particular direction without physically moving the array of antennas. Phased arrays can be used in various forms of communication and radar. Types of phased arrays can be Active Electronically Scanned Array (AESA) or Passive Electronically Scanned Array (PESA). Phased array systems can require large amounts of power, in some cases over 500 watts, and can include a power supply that generates multiple voltage outputs for the phased array system. Multiple units of the phased array, e.g., radio frequency circuits that generate or receive a signal at each of the antenna of the array, can share the multiple supply powers. However, if one of the radio frequency circuits fails in such a way as to disrupt the power supply, every radio frequency circuit may fail.

Furthermore, the radio frequency circuits can require multiple supply powers, e.g., over four. This adds a high level of expense to printed circuit board (PCB) fabrication and/or system design due to requiring additional layers for the multiple power supplies. Furthermore, storage capacitance for each voltage rail for the supply powers is difficult to obtain in a small lattice area which many phase array systems have. Furthermore, as frequency of the phase array system increases, the size of the radio frequency circuits reduces to lower node size integrated circuits which require lower supply voltages. For example, voltages may be under 1 volt across wire lengths greater than twelve inches and currents greater than 500 amps.

SUMMARY

In one aspect, the inventive concepts disclosed herein are directed to a phased array system. The phased array system includes an antenna system including multiple antennas configured to transmit or receive signals. The phased array system includes a power supply circuit configured to generate a supply power and provide the supply power to multiple distributed power supply circuits. The phased array system includes the distributed power supply circuits, each of the distributed power supply circuits configured to receive the supply power from the power supply circuit and generate radio frequency supply powers for one of the radio frequency circuits. The phased array system includes the radio frequency circuits, each of the radio frequency circuits configured to cause one of the antennas to transmit or receive the signals based on the radio frequency supply powers.

In a further aspect, the inventive concepts disclosed herein are directed to a power supply system for a phased array system. The power supply system includes a power supply circuit configured to generate a supply power and provide the supply power to distributed power supply circuits and the distributed power supply circuits, each of the distributed power supply circuits configured to receive the supply power from the power supply circuit and generate radio frequency supply powers for one of the radio frequency circuits of the phased array system.

In a further aspect, the inventive concepts disclosed herein are directed to a multi-chip-module for a phased array system. The multi-chip-module includes a distributed power supply circuit, the distributed power supply circuit configured to receive a supply power from a power supply circuit and generate radio frequency supply powers for a radio frequency circuit of the multi-chip-module. The multi-chip-module further includes the radio frequency circuit, the radio frequency circuit configured to cause an antenna to transmit or receive a signal based on the radio frequency supply powers.

BRIEF DESCRIPTION OF THE DRAWINGS

Implementations of the inventive concepts disclosed herein may be better understood when consideration is given to the following detailed description thereof. Such description makes reference to the annexed drawings, which are not necessarily to scale, and in which some features may be exaggerated and some features may be omitted or may be represented schematically in the interest of clarity. Like reference numerals in the figures may represent and refer to the same or similar element, feature, or function. In the drawings.

DETAILED DESCRIPTION

Figure 1:
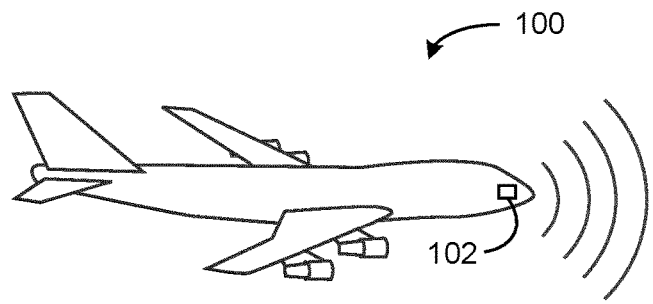
FIG. 1 is a perspective view schematic drawing of an aircraft with a phased array system, according to exemplary aspects of the inventive concepts disclosed herein.

Before describing in detail the inventive concepts disclosed herein, it should be observed that the inventive concepts disclosed herein include, but are not limited to, a novel structural combination of power supplies, analog circuits, data/signal processing components, sensors, and/or communications circuits, and not in the particular detailed configurations thereof. Accordingly, the structure, methods, functions, control and arrangement of components, software, and circuits have, for the most part, been illustrated in the drawings by readily understandable block representations and schematic diagrams, in order not to obscure the disclosure with structural details which will be readily apparent to those skilled in the art, having the benefit of the description herein. Further, the inventive concepts disclosed herein are not limited to the particular embodiments depicted in the exemplary diagrams, but should be construed in accordance with the language in the claims.

Referring generally to the figures, systems and methods for distributed power supply circuits for a phased array system are described with respect to various aspects of the inventive concepts. In some embodiments, a phased array system includes a single power supply that provides multiple supply voltages to radio frequency circuits of the phased array. However, if one of the radio frequency circuits fails and disrupts the supply voltage, all of the radio frequency circuits can fail since they each share the same power supply. In this respect, a distributed power supply including multiple distributed power supply circuits configured to each locally generate the supply voltages for individual radio frequency circuits can be implemented in the phased array system. This distributed solution increases fault tolerance of the phased array system and improves efficiency by utilizing less power for the phased array system.

Since the power supply is distributed, startup and shutdown power sequencing and/or bulk storage of the radio frequency circuits can be performed by the distributed power supply circuits on an individual basis. By distributing the power supply circuits, parasitic capacitance can be reduced and a higher degree of confidence can be achieved. The distributed power supply can implement local radio frequency circuit envelope tracking and/or dynamic power control and can include efficient taper by implementing switch-mode power supply back off at the radio frequency level as opposed to linear regulation.

Efficient taper can be implemented by the distributed power supply circuits by decreasing output power of the elements that are further away from the center of the phased array (e.g., power supply circuits can decrease the output power they generate, lower voltage, if they are located farther away from the center of the phased array system). This creates a beam pattern with lower sidelobe levels. With all components on the same voltage supply, taper is implemented by backing off the input power and running all but a few cells (e.g., a predefined number of cells) below maximum power which means running almost every cell at the same direct current (DC) power consumption. With distributed power supplies, the voltage can be lowered for cells further away from the center allowing each cell to be run at close to maximum power which minimizes the DC power consumption of the array.

Each distributed power supply can be programmed with an indication of where in the array they are located so that the distributed power supply can perform the particular taper operations (e.g., certain locations may correspond with backing off power while others may not). In various embodiments, the distributed power supply circuits can receive an indication of location and/or an indication to act as a power supply that backs off power to implement efficient taper. The indications can be programmed such that a power supply circuit can be programmed and/or reprogrammed with the location/back off indication so that the power supply circuits can all be identical in construction, only the programmed indication may be different.

While the distributed power supply circuits provide many operational efficiency and fault tolerance benefits, the distributed power supply circuits also provide design and testing benefits. For example, utilizing distributed power supply circuits allows for co-simulation down to the junction scale across full process, voltage, and temperature (PVT). The distributed power supply allows for easy array size flexibility as each radio frequency circuit is associated with its own particular power supply circuit, reducing the design cycle time of a phased array system.

Further regarding design and testing, a distributed power supply can simplify factory testing. For example, standalone tests can be performed for the phased array system (e.g., phased array panel stand-alone tests) and are possible since the power supply circuits are distributed and specific for each RF circuit. The equipment performing the tests does not need to perform power sequencing. In some cases, improper test equipment power sequencing can damage phased array systems, this failure point is removed if the distributed power supply circuits each perform power sequencing locally and do not require the test equipment to perform power sequencing for the phased array system. Local sequencing of the RF integrated circuits can further be implemented when the phased array system is being turned on and/or off when in the field.

Digital integration of the distributed power supply with the RF integrated circuits allows for complex tuning and algorithm control to be implemented along with system monitoring. Furthermore, since shorter (or no) traces are run between the distributed power supply circuits and the radio frequency circuits, wire losses for transporting power can be minimized. Furthermore, instead of creating multiple PCB layers for each of the multiple power supplies generated locally by the distributed power supply, the amount of copper in the PCB layers is reduced allowing for lower inductance and resistance. Since multiple traces are not run across the board, less current is required for supply powers. The high level of integration of the distributed power supply allows for efficient voltage sampling at many locations in the power supply, allowing for higher levels of control and higher precision across Process, Voltage, and Temperature (PVT) variations in both power supplies and beamformer integrated circuits.

By distributing power supply circuits across the phased array system to unit cells improves power supply efficiencies for the phased array system and simplifies the most expensive component of a phased array system, the main PCB. Not only does distributing the power supplies to the unit cell improve power supply efficiency for the phased array system by quickly reacting to varying loads (systems with varying loads e.g., pulsed radar systems or time division duplex (TDD) systems), it drastically increases mean time between failure (MTBF) due to its fault tolerant nature.

The distributed power supply as discussed herein enables hybrid low earth orbit (LEO) and geostationary earth orbit (GEO) (or GEO-only) airborne phased arrays. The distributed power supply system permits smaller apertures (lower power, lower cost, lower drag) to be installed on an airplane and still operate at baseline spectral efficiencies, preserving profit margins on data services.

Referring now to FIG. 1, an aircraft 100 including a phased array system 102 is shown, according to an exemplary embodiment. The aircraft 100 is shown to be an airliner. However, aircraft 100 may be any kind of commercial aircraft, military aircraft, helicopter, unmanned aerial vehicle (UAV), spacecraft, car, truck, motorcycle, tank, Humvee, and/or any other kind of vehicle, manned or unmanned. The aircraft 100 is shown to include a phased array system 102. The phased array system can be a radar or communication system configured to transmit and receive signals.

The phased array system 102 can be a computer-controlled array of antennas which generate a beam of radio waves electronically steered in a particular direction without physically moving the array of antennas. The phased array system 102 can be configured to perform communication and/or radar. The phased array system 102 can be an Active Electronically Scanned Array (AESA) system or a Passive Electronically Scanned Array (PESA) system.

Figure 2:
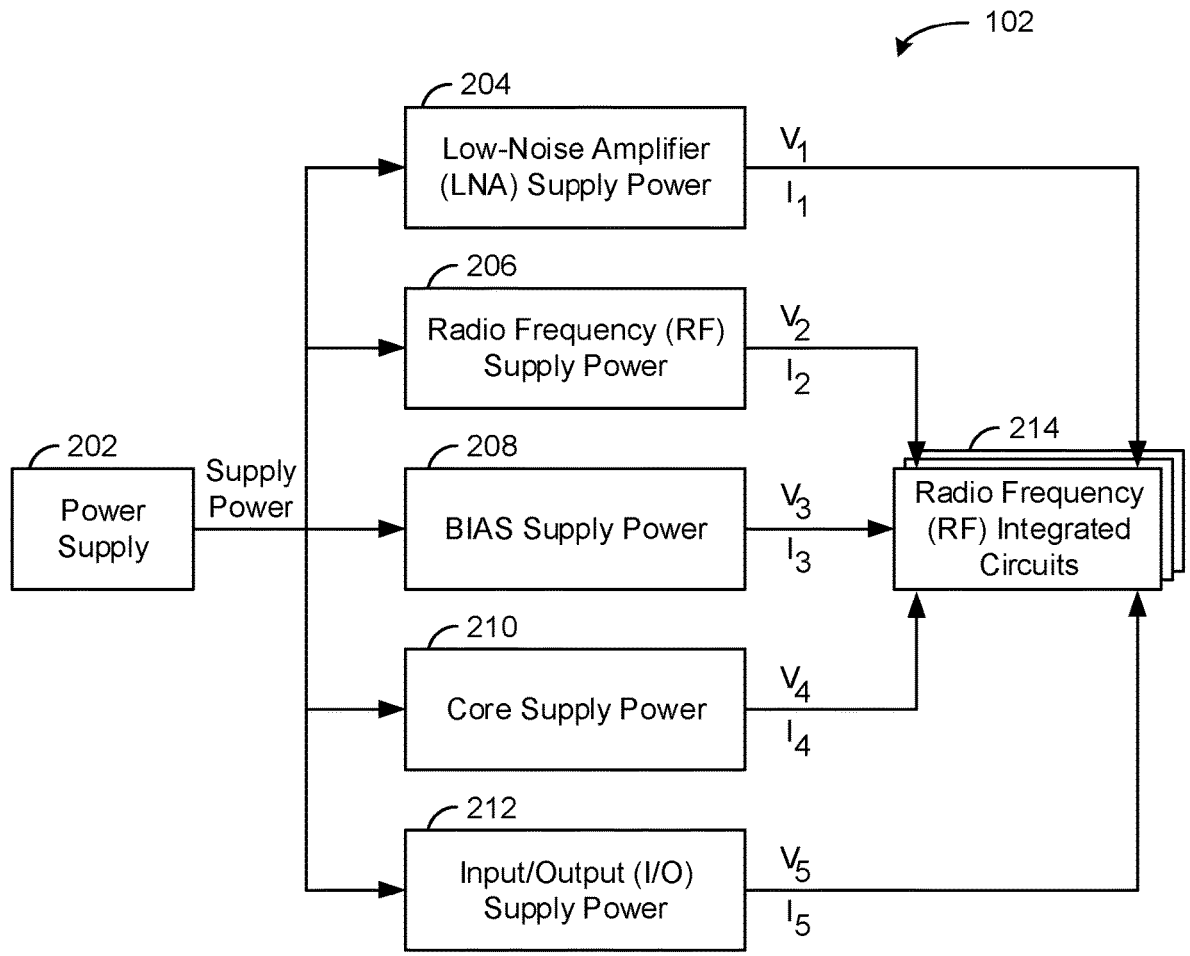
FIG. 2 is a circuit block diagram of the phased array system of FIG. 1 including a single power supply generating multiple supply powers for radio frequency (RF) integrated circuits of the phased array system of FIG. 1, according to exemplary aspects of the inventive concepts disclosed herein.

Referring now to FIG. 2, a circuit block diagram of the phased array system 102 is shown, according to an exemplary embodiment. The phased array system 102 is shown to include a power supply 202 and multiple RF integrated circuits 214. The power supply 202 is configured to generate supply powers 204-212 for the RF integrated circuits 214. The supply powers 204-212 can be distributed to the integrated circuits 214 via various electrical connections (e.g., wires, circuit board traces, etc.). The power supply 202 can include one or multiple circuits to generate each of the supply powers 204-212, e.g., transformer circuits, switch mode power supply (SMPS) circuits, linear power supply circuits, buck converter circuits, inverting charge pump circuits, and/or any other power supply circuit. The power supply 202 can be and/or can include generators, batteries, solar cells, and/or any other energy generating source for generating the supply powers 204-212.

The supply powers 204-212 can include a supply power for a low-noise amplifier (LNA), i.e., LNA supply power 204, a RF supply power 206, a BIAS supply power 208, a core supply power 210, and an input/output (I/O) supply power 212. The voltages generated for the supply powers 204-212 can be any value and, in some embodiments, can have a nominal range from 0.5 volts to 5 volts and/or higher dependent on the use of the supply powers 204-212. A voltage of 2.5 volts and a current of 25.6 amperes (or any other voltage or current) can be generated for the LNA supply power 204. A voltage of 2.2 volts and a current of 46.5 amperes (or any other voltage or current) can be generated for the RF supply power 206. A voltage of −5.0 volts and a current of 12.8 mille amperes (or any other voltage or current) can be generated for the BIAS supply power 208. A voltage of 1.2 volts and 4.25 amperes (or any other voltage or current) can be generated for the core supply power 210. Finally, a voltage of 2.5 volts and current of 4.25 amperes (or any other voltage or current) can for generated by the I/O supply power 212.

If the current of one of the supply powers 204-212 is high, (e.g., 46.5 amps and/or above any particular value) this may indicate that one of the RF integrated circuits 214 is malfunctioning since this high current draw from the power supply 202 can be caused by one of the RF integrated circuits 214 malfunctioning. This high current draw may cause a fire or the power supply 202 to fail in its entirety. In this regard, a single RF integrated circuit 214 failing can cause the entire phased array system 102 to fail.

Each of the supply powers 204-212 is supplied to the RF integrated circuits 214, according to some embodiments. The RF integrated circuits 214 can be configured to generate signals and/or receive signals via antenna of phased array system 102, perform modulation, perform demodulation, perform amplification, phase shifting, and/or any other operation to implement the phased array system 102 via the supply powers 204-212. The RF integrated circuits 214 may be "beamformer" circuits, circuits configured to generate or receive signals, e.g., generate beams for the phased array system 102. Examples of beamformer circuits and other RF circuits that the RF integrated circuits 214 may be can be found in U.S. patent application Ser. No. 15/792,479 filed Oct. 24, 2017, U.S. patent application Ser. No. 15/697,262 filed Sep. 6, 2017, and U.S. patent application Ser. No. 15/600,497 filed May 19, 2017, the entirety of each of these patent applications is incorporated by reference herein.

The phased array system 102, i.e., the RF integrated circuits 214, may require multiple different supply voltages, each with a voltage tolerance that may be within five to ten percent for the RF integrated circuit 214 to operate correctly. Therefore, if each of the supply powers 204-212 is routed via various traces or voltage rails to the RF integrated circuits 214, factors such as parasitic capacitance can create reliability and/or design issues to properly power the RF integrated circuits 214. Furthermore, at each of the integrated circuits 214, there may not be any way to correct for the errors in the voltage level.

Using a single power supply, e.g., the power supply 202, to generate all the supply powers necessary for the RF integrated circuits 214 can give acceptable results for lower power and higher voltage devices. However, for high frequency phased array systems which require low voltage and high current, PCB fabrication may be difficult. Furthermore, not having redundancy in the power supply decreases mean time between failure (MTBF).

In some embodiments, a redundant power supply can be implemented to supplement the power supply 202 in case the power supply 202 fails. However, this doubles the cost and PCB area consumption as compared to a single power supply. In some embodiments, a single power supply can include feeder linear regulators for low current rails, however, this results in lower efficiency due to the linear regulators. Overall, low voltage but high current rails are difficult to maintain in the phased array system 102 since small resistive losses on the PCBs causes large percentage swings on the supply voltage. This can cause calibration issues as beamformers do not have the same transfer characteristics across voltage.

Figure 3:
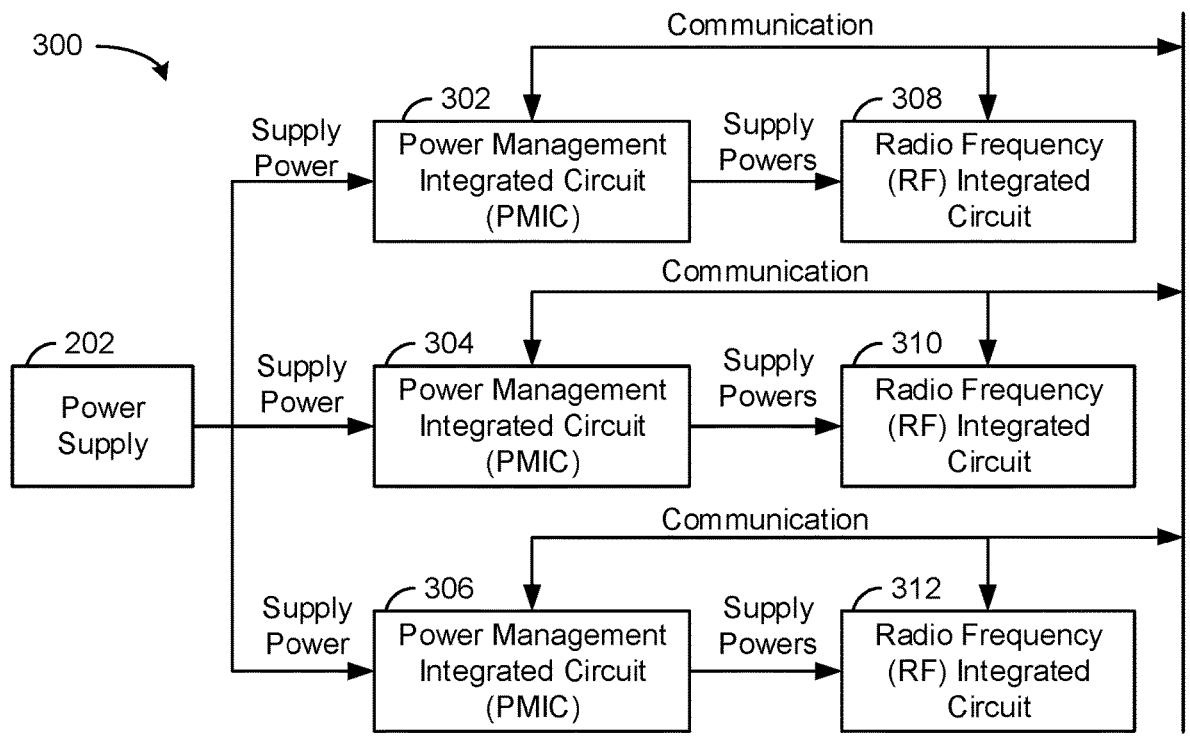
FIG. 3 is a circuit block diagram of the phased array system of FIG. 1 including power management integrated circuits (PMICs) generating supply powers for RF integrated circuits based on a supply power generated by a power supply, the PMICs being separate integrated circuits from the RF integrated circuits, according to exemplary aspects of the inventive concepts disclosed herein.

Referring now to FIG. 3, a circuit block diagram of a circuit 300 configured to implement local power supplies for multiple RF integrated circuits is shown, according to an exemplary embodiment. The circuit 300 includes the power supply 202 configured to generate a single supply power. The power supply 202 can be configured to provide the single supply power, e.g., a voltage and current, to each of multiple power management integrated circuits (PMICs), i.e., PMICs 302-306. Each of the PMICs 302-306 can be configured to generate multiple supply powers based on the single supply power received from the power supply 202 and provide the multiple supply powers to the RF integrated circuits 308. The PMICs 302-306 can be silicon on insulator (SOI) complementary metal-oxide-semiconductor (CMOS) circuits and/or circuits built with any other semiconductor process. In some embodiments, the signal supply power is a high voltage supply power and the multiple supply powers are low voltage supply powers. The RF integrated circuits 308 may be the same as and/or similar to the RF integrated circuits 214 as described with reference to FIG. 2.

The high level of digital integration of the circuit 300 allows for the circuit 300, specifically the PMICs 302-306, to be a smarter power supply that can adapt to more situations. Furthermore, a high level of analog-to-digital conversion (ADC) and voltage/current monitoring can be done on chip so the PMICS 302-306 has move information on power supply and load operation.

The circuit 300 can be implemented in the phased array system 102 such that one of the PMICs 302-306 is implemented for each of the RF integrated circuits 308-312. The PMICs 302-306 implemented in a phased array system 102 provide a distributed power supply within the phased array system 102. In this regard, each of the PMICs 302-316 is configured to operate independently from each other and can each be configured to power the integrated circuits 308-312. In the event that one of the PMICs 302-306 fails, each of the PMICs 302-306 can be configured to open (e.g., operate an electronic or mechanical switch), so as not to disrupt the supply power generated by the power supply 202 (e.g., operating the switch causes the PMICs 302-306 to form an open circuit with the power supply 202).

Taking PMIC 302 and RF integrated circuit 308 as an example, the PMIC 302 and the RF integrated circuit 308 can be configured to communicate with each other. The RF integrated circuit 308 can provide information to the PMIC 302 regarding the load which the integrated circuit 308 places on the PMIC 302. In some embodiments, the communication is a serial communication protocol, e.g., Serial Peripheral Interface (SPI), Inter-Integrated Circuit (I2C), Universal Asynchronous Receiver-Transmitter (UART), Universal Synchronous And Asynchronous Receiver-Transmitter (USART), and/or any other communication protocol. The communication between the RF integrated circuits 308 and the PMIC 302 and even among multiple PMICs 302-306 can implement a highly integrated level of operation for each PMIC since each PMIC of the PMICs 302-306 knows the current state of the RF integrated circuits 308-312, itself, and the other PMICS 304 and 306.

The PMIC 302 can be configured to adjust the supply powers (one or multiple of the supply powers) that the PMIC 302 is configured to generate and provide the RF integrated circuit 308. For example, the RF integrated circuit 308 can implement envelope tracking based on communication received from the RF integrated circuit 308 to adjust a voltage level of one of the supply powers to reduce unnecessary power usage of the PMIC 302. The PMICs 302-306 can implement efficient modulation on transmission of signals and dynamic linearity on receiving signals for anti jam capabilities based on the communication between the PMIC 302 and the RF integrated circuit 308. In this regard, the communication between the PMIC 304 and the RF integrated circuit 310 can allow for dynamic supply requests and control of the supply powers (e.g., control of a voltage level of the supply powers) generated by the PMIC 302.

The PMICs 302-306 can be configured to implement anti jam capabilities. The PMICs 302-306 can be configured to receive and/or detect an indication that there is a large signal, a jamming signal, (e.g., the antennas associated with the RF integrated circuits 308-312 can receive the jamming signal and the RF integrated circuits 308-312 can detect the jamming signal and communicate the presence of the jamming signal to the PMICs 302-306). The PMICs 302-306 can increase the supply voltages they generate pulling the receivers out of compression at the expense of increased DC power consumption to perform anti-jam.

Furthermore, in some embodiments, each of the RF integrated circuits 308-312 (or the PMICs 302-306) can include temperature sensors. The temperature sensors can be analog and/or digital temperature sensing devices and can be and/or include Negative Temperature Coefficient (NTC) thermistors, Resistance Temperature Detectors (RTDs), thermocouples, and/or semiconductor-based sensors. Since there are multiple integrated circuits 308-310, often formed implemented as a grid of devices, heat may concentrate in the center of the grid. In this regard, based on measured temperature (and/or communicated temperature measurements), the PMICs 302-306 can adjust the supply powers to prevent overheating in certain areas of the board, e.g., in the center.

Figure 4:
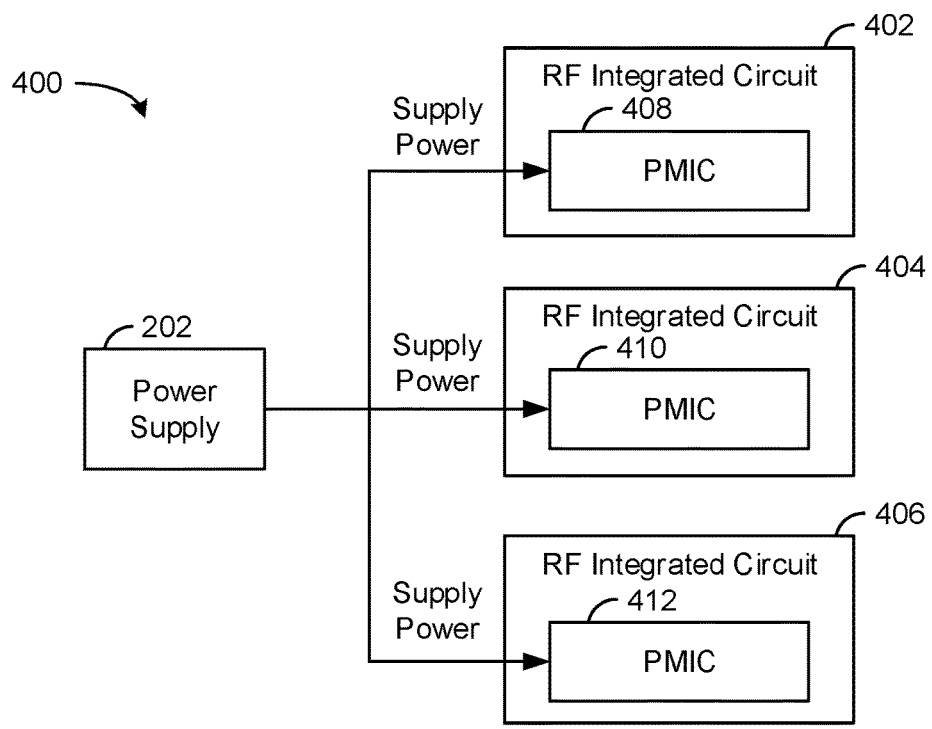
FIG. 4 is a circuit block diagram of the phased array system of FIG. 1 including PMICs generating supply powers for RF integrated circuits based on a supply power generated by a power supply, each of the PMICs being integrated with the RF integrated circuits, according to exemplary aspects of the inventive concepts disclosed herein.

Referring now to FIG. 4, a circuit block diagram of a circuit 400 is shown, according to an exemplary embodiment. The circuit 400 may be similar to the circuit 300 with the exception that PMICs are implemented within RF integrated circuits. In this regard, a communication protocol is not necessarily required since the PMICs are local within the RF integrated circuits although a communication can in some embodiments be implemented between PMICs 408-412 so that each of PMICs 408-412 receives an indication of the state of the other PMICs 408-412.

RF integrated circuits 402-406 can be the same as or similar to the RF integrated circuits 308-312 as described with reference to FIG. 3 and the RF integrated circuits 214 as described with reference to FIG. 2. The PMICs 408-412 can be the same as or similar to the PMICs 302-306 as described with reference to FIG. 3. The power supply 202 can generate a single supply power and provide the supply power to the RF integrated circuits 402-406. Since each of the RF integrated circuits 402-406 include a PMIC, the PMICs 408-412, each of the PMICs 408-412 can generate one or multiple supply powers based on the single supply power generated by the power supply 202 for operating the RF integrated circuits 402-406.

However, the PMICs 408-412 can be integrated within the RF integrated circuits 402-406. Integrating the PMICs 408-412 within the RF integrated circuits 402-406 can reduce circuit board size and/or reduce the area which the RF integrated circuits 402-406 and the PMICs 408-412 take up. Furthermore, the same dynamic control of supply powers as described with reference to FIG. 3 can be implemented without requiring the communication between integrated circuits, i.e., communication protocols for communicating between chips.

Figure 5:
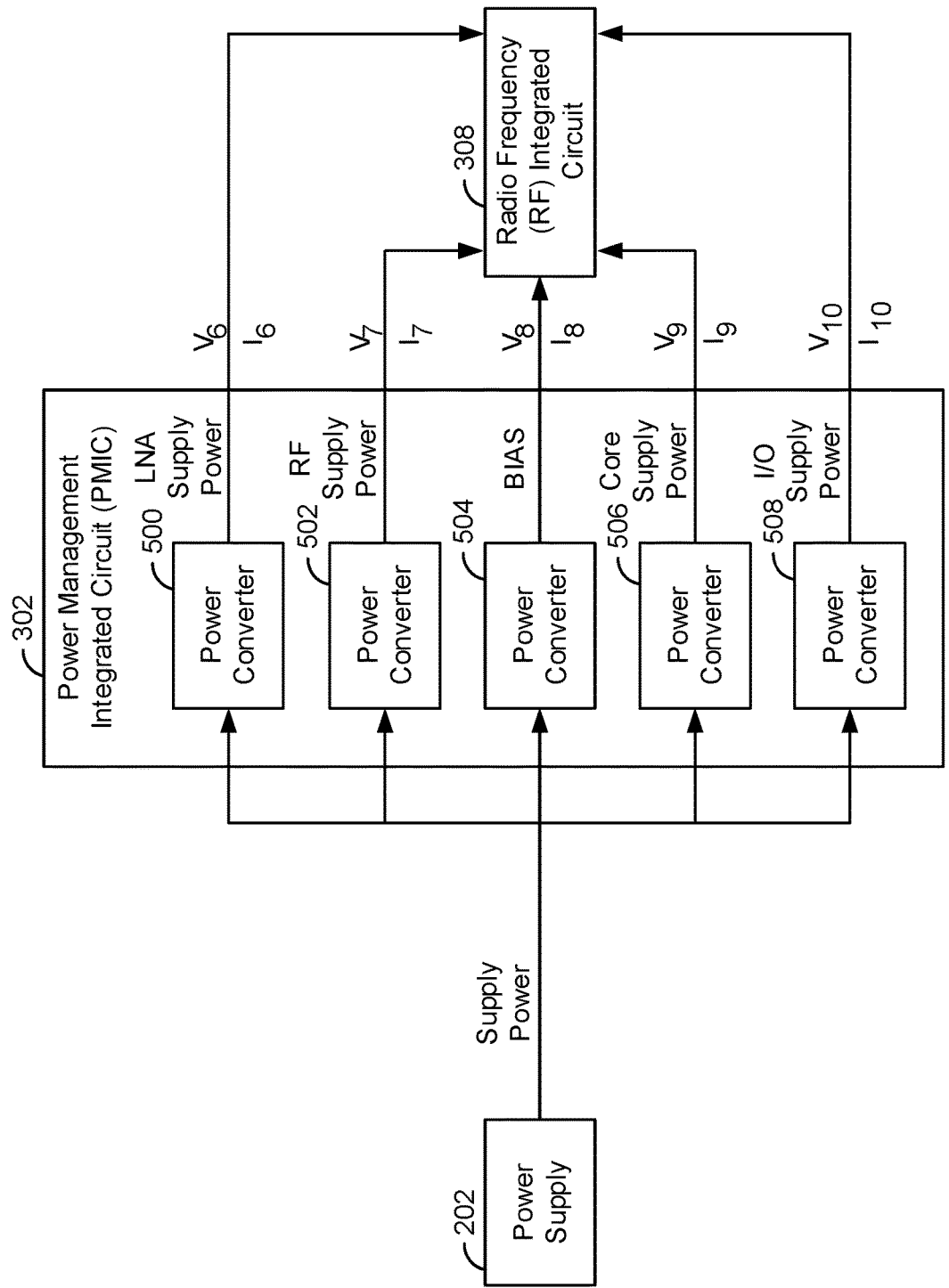
FIG. 5 is a circuit block diagram of one of the PMICs of FIGS. 3-4 in greater detail powering one of the RF integrated circuits, according to exemplary aspects of the inventive concepts disclosed herein.

Referring now to FIG. 5, the PMIC 302 of FIG. 3 is shown in greater detail, according to an exemplary embodiment. Although the PMIC 302 is shown to be separate from the RF integrated circuit 308 (e.g., as shown in FIG. 3), the PMIC 302 can also be integrated within the RF integrated circuit 308 (e.g., as shown in FIG. 4). PMIC 302 is configured to receive the supply power from power supply 202 and utilize multiple circuits to generate various supply powers for the RF integrated circuit 308. The PMIC 302 can include multiple power converters 500-508. The power converters 500-508 can be, but are not limited to, buck converters, boost converters, inverting charge pumps, switched capacitors, etc. The power converters 500-508 can be configured to generate an LNA supply power, an RF supply power, a BIAS, a core supply power, an I/O supply power, and/or any other power supply power.

The PMIC 302, based on a supply power generated by the power supply 202 (e.g., a 5 volt supply power or any other supply power), can generate any power supply, for example, 0.5 volt to 5 volt power supplies. Examples of the voltages and currents that the PMIC 302 can generate with the power converters 500-508 can be a 1.5 volt 0.133 ampere LNA supply power, a 1.0 volt 0.4 ampere RF supply power, a −0.5 volt 5 mille ampere BIAS, a 1 or 0.9 volt 50 mille ampere core supply power, and/or a 1.2 volt 50 mille ampere I/O supply power, however, any voltage or current level can be generated by the power converters 500-508 of the PMIC 302. As compared to the single power supply system of FIG. 2, instead of requiring a high voltage (e.g., a 28 volt supply power) to be generated by the power supply 202, only a low voltage supply (e.g., a 5 volt supply power) is needed to be generated. Because of the distributed nature of the PMICs, to generate the same 1 volt rail with the PMICs requires approximately 20 percent of the current that the power supply of FIG. 2 requires. Using less current realizes less wire losses (IR losses) which implements higher efficiency in the power supply system.

Figure 6:
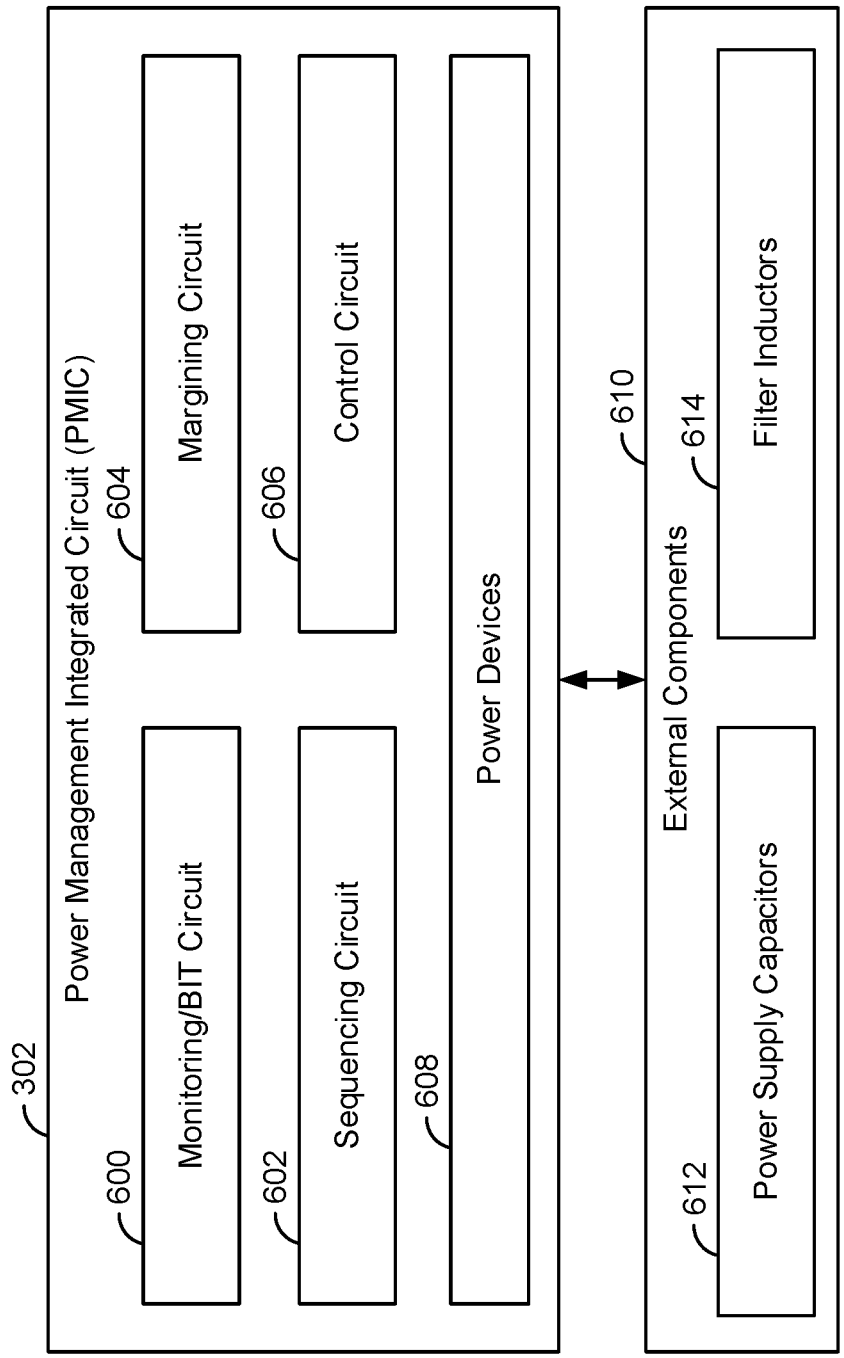
FIG. 6 is a circuit block diagram of one of the PMICs of FIGS. 3-4 including various components, according to exemplary aspects of the inventive concepts disclosed herein.

Referring now to FIG. 6, the PMIC of FIG. 3 is shown in greater detail, according to an exemplary embodiment. The PMIC 302 includes various circuits and devices within the PMIC 302 and various external components 610 outside the PMIC 302. The external components 610 are power supply capacitors 612 and filter inductors 614.

The power supply capacitors 612 can include decoupling capacitors, filtering capacitors, and/or any other capacitor for a power supply. The capacitors can include electrolytic capacitors, ceramic capacitors, tantalum capacitors, polycarbonate capacitors, and/or any other type of capacitor. The filter inductors 614 can be configured to perform power supply filtering and can be air core inductors, iron core inductors, ferrite core inductors, and/or any other type of inductor.

The PMIC 302 is shown to include power devices 608. The power devices can include regulators, transistors, diodes, and/or any other component for generating one or multiple supply powers. PMIC 302 is further shown to include monitoring/BIT circuit 600, margining circuit 604, sequencing circuit 602, and control circuit 606. The circuits 600-606 can operate the power devices 608 to adjust each of the supply powers generated by the PMIC 302. The circuits 600-606 can be implemented as one or multiple processing circuits, e.g., logic circuits (e.g., complementary metal-oxide-semiconductor (CMOS) logic circuits), processors, memory devices, etc.

The monitoring/BIT circuit 600 can be configured to implement power supply monitoring and testing (i.e., built in test (BIT)). The monitoring/BIT circuit 600 can be configured to perform tests on the PMIC 302 and the external components 610 in addition to monitoring the PMIC 302 to determine if a fault has occurred (e.g., measure voltages, currents, etc.). In response to a detection of a fault (e.g., a supply voltage rising or falling below a predefined amount), the monitoring/BIT circuit 600 can be configured to shut off the PMIC 302 and "open" e.g., stop using power from the power supply 202 by opening various switches.

The margining circuit 604 can be configured to adjust voltages of the supply powers by operating the power devices 608 to verify system performance margin with respect to a supply voltage. The sequencing circuit 602 can be configured to control the voltages of the supply powers generated by the PMIC 302 for powering up and/or powering down the RF integrated circuit that the PMIC 302 provides power to. For example, the sequencing circuit 602 is configured to operate the power devices 608 to provide power at particular sequences for the various supply powers generated by the PMIC 302 in some embodiments.

The control circuit 606 can be configured to operate power devices 608 to reduce power consumption of the RF circuits which the PMIC 302 operates. For example, the control circuit 606 can perform envelope tracking by tracking an envelope of a transmission signal and adjusting the voltage of the supply powers based on the tracked envelope. The PMIC 302 can be coupled to a particular RF integrated circuit in order to track the envelope of the transmission signal of the RF integrated circuit or may receive data from the particular RF integrated circuit indicative of the envelope. Since envelope tracking is implemented on a PMIC by PMIC basis, multiple PMICs could each perform envelope tracking simultaneously, each adjusting the voltage of a supply power differently based on the envelope of the transmitted signal.

The load which the RF integrated circuit places on the PMIC 302 can be dynamic. More specifically, the load may be changing over time, i.e., the load is time varying. In this regard, the control circuit 606 can operate voltage levels of supply powers generated for the RF integrated circuit to adapt to change based on the time varying load.

Furthermore, the control circuit 606 can be configured, based on communication with other PMICs, to sequence the operation of supply powers to stagger the power draw of the RF circuits which the PMICs power. Furthermore, the control circuit 606 can perform dynamic linearity for received signals for anti jam capabilities. The control circuit 606 can also, based on temperatures measured across the phased array system 102, operate the supply voltages to prevent heat from being concentrated in the center of the phased array system 102.

Figure 7:
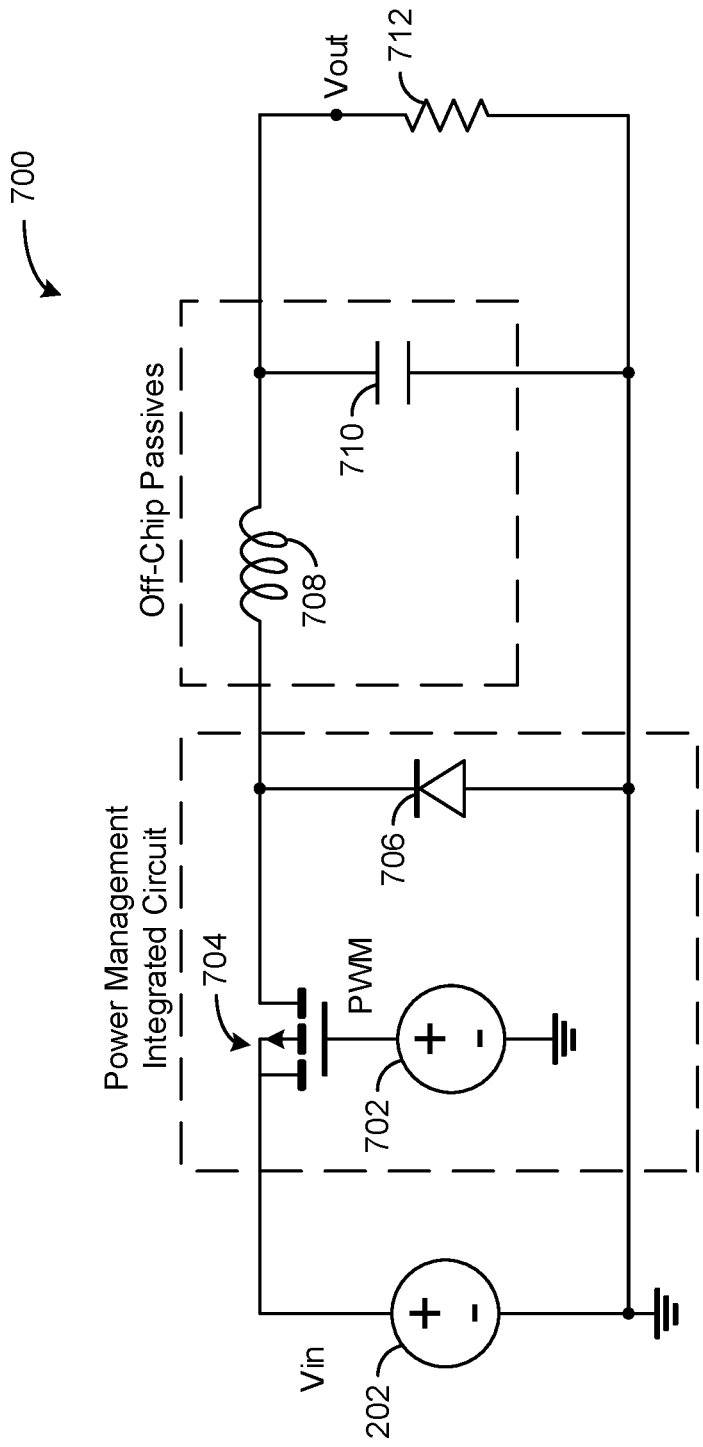
FIG. 7 is a circuit block diagram of a buck converter that the PMICs of FIGS. 3-4 can implement, according to exemplary aspects of the inventive concepts disclosed herein.

Referring now to FIG. 7, a buck converter circuit 700 is shown, according to an exemplary embodiment. The buck converter circuit 700 can illustrate one or multiple of the power converters 500-508 as described with reference to FIG. 5.

The buck converter circuit 700 is shown to include the power supply 202. The power supply is shown to be connected to a P-channel metal-oxide-semiconductor field-effect transistor (MOSFET), transistor 704. Although the transistor 704 is shown in FIG. 7 as a P-channel MSOFET, the transistor 704 can be an N-channel MOSFET, a N-channel field-effect transistor (FET), a P-channel FET, a N-type bipolar junction transistor (BJT), and/or a P-type BJT. In some embodiments, the transistor 704 is a silicon on insulator (SOI) transistor. SOI transistors may be high performance switches due to their low parasitic capacitances. The transistor 704 is shown to be controlled by a PWM signal generated by voltage source 702.

The circuit 700 is shown to include a diode 706 (which can also be any other switching component e.g., a MOSFET, a BJT, etc.), inductor 708, and capacitor 710. The circuit 700 can create a voltage over load 712 at a particular level relative to the voltage of the power supply 202, and based on how transistor 704 is switched by voltage source 702. More specifically, the voltage of the load 712 is a function of the duty cycle of the PWM wave generated by voltage source 702 and the voltage level of the voltage source 202.

The output voltage over the load 712 can be defined with the equation:

$$D = \frac{V_{out} - V_D}{(V_{in} - V_{Trans} - V_D)}$$

where D is the duty cycle of the PWM signal, $V_{out}$ is the voltage over the load 712, $V_D$ is the voltage over the diode 706, $V_{in}$ is the voltage of the voltage source 702, and $V_{Trans}$ is the voltage over the transistor 704. The equation above is a generalized equation and can be modified to account for core magnetic element losses and/or IR losses in the physical connections of the circuit 700.

Neglecting the voltage drops over the transistor 704 and the diode 706, the output voltage can be defined as:

$$V_{out} = DV_{in}$$

the equation $V_{out}=DV_{in}$ is a generalized equation and can be modified to account for core magnetic element losses and/or IR losses in the physical connections of the circuit 700.

The circuit 700 can be implemented within the PMIC 302 as described with reference to FIG. 6. In this regard, PWM signal source 702, the transistor 704, and the diode 706 can be the power devices 608 that the PMIC 302 can be configured to control to generate specific output voltage (e.g., for use in envelope tracking) while the inductor 708 and the capacitor 710 can be the external components 610. The PMIC 302 can be configured to adjust the duty cycle of the PWM signal source 702 to control the voltage level across load 712.

In some embodiments, multiple transistors are stacked in parallel instead of the single transistor 704. The number of switches that are in parallel and are on at a time can control the slew rate and can reduce emissions of the entire power supply (e.g., reduce spurs generated by switching transistor 704). The PMICs can be configured to turn a certain number of transistors on at the same time.

Figure 8:
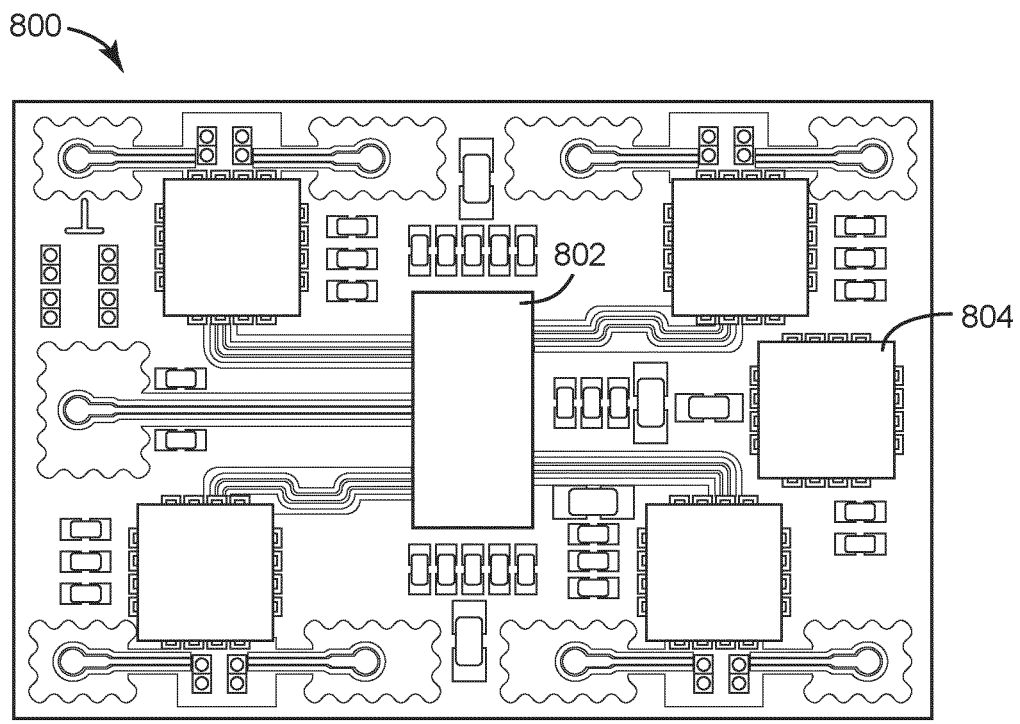
FIG. 8 is a multi-chip-module (MCM) of the phased array system of FIG. 1 for operating an antenna of the phased array system of FIG. 1, the MCM including an RF integrated circuit and a PMIC integrated circuit, according to exemplary aspects of the inventive concepts disclosed herein.

Referring now to FIG. 8, a multi-chip-module (MCM) 800 is shown for the phased array system 102, according to an exemplary embodiment. The MCM 800 can include multiple die on an interposer. The MCM 800 includes multiple integrated circuits interconnected on a substrate. The substrate can be a printed circuit board (PCB), a high density interconnection (HDI) substrate, and/or any other type of substrate. The MCM 800 can be any kind of MCM, for example, a laminated MCM (MCM-L), a deposited MCM (MCM-D), a ceramic substrate MCM (MCM-C) and/or any other type of MCM. The MCM 800 is shown to include multiple RF circuits including a beamformer 802 and a PMIC 804. Where multiple MCM 800 are implemented in a phased array system, each MCM can have separate negative bias supply, removing failures were one negative supply shorts to ground causing explosive failure of entire board MCM 800 may be a single cell of a phased array, e.g., the phased array system 102. The beamformer 802 can be the same as and/or similar to the RF integrated circuits as described with reference to FIGS. 2-7 while the PMIC 804 can be the same as and/or similar to the PMICs as described with reference to FIGS. 3-8. The PMIC 804 is located on the substrate of MCM 800 separate from the beamformer 802. Capacitors and/or inductors for the PMIC 804 can be located on the substrate of the MCM 800 and/or can be integrated within the PMIC 804. Implementing the inductor and capacitor on the MCM substrate can enable higher densities and/or improve efficiency of the PMIC 804. While the PMIC 804 can receive an external supply power (e.g., a single supply power), the beamformer 802 can be powered via multiple supply powers generated by the PMIC 804. Furthermore, communication can occur between the beamformer 802 and the PMIC 804 to dynamically adjust voltage levels of the supply powers generated by the PMIC 804 for the beamformer 802 based on the time changing load of the beamformer 802.

Multiple MCMs, similar to the MCM 800 can be implemented as cells in the phased array system 102. In this regard, each MCM can include its own beamformer circuit. Since the PMICs can be distributed across the MCMs, the efficiency and/or fault tolerance of the phased array system 102 can increase since one or multiple MCM power supplies (PMICs) can fail without disrupting the phased array system 102.

Figure 9:
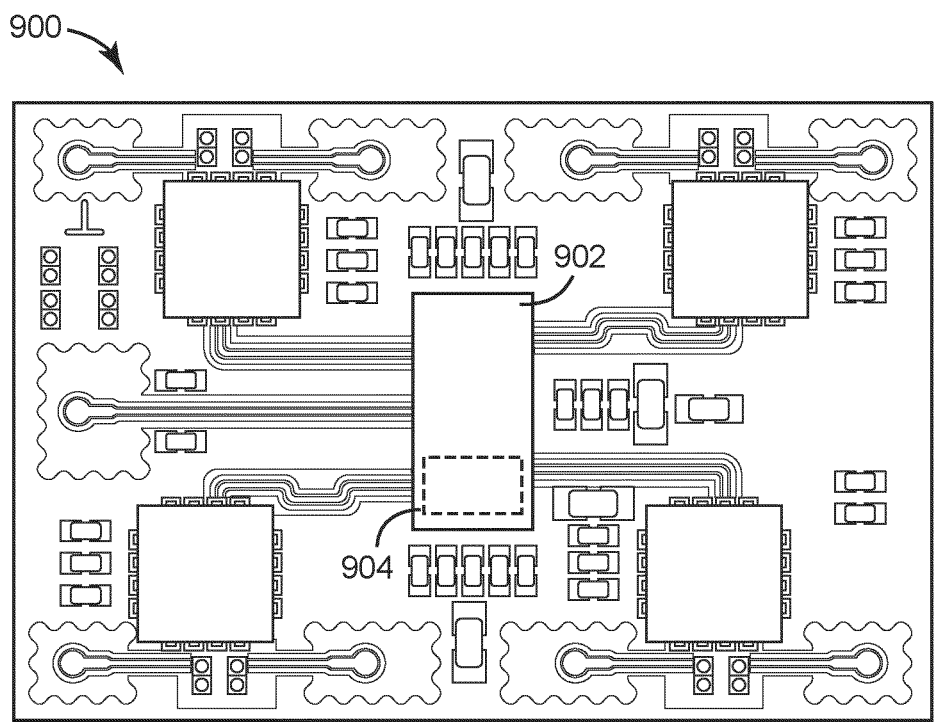
FIG. 9 is another multi-chip-module (MCM) of the phased array system of FIG. 1 for operating an antenna of the phased array system of FIG. 1, the MCM including an RF integrated circuit including a PMIC circuit, according to exemplary aspects of the inventive concepts disclosed herein.

Referring now to FIG. 9, a MCM 900 is shown including multiple RF integrated circuits and a PMIC integrated within one of the RF integrated circuits, according to an exemplary embodiment. MCM 900 is shown to include a beamformer 902. The beamformer 902 can be the same as and/or similar to the RF integrated circuits as described with referenced to FIGS. 1-7. The PMIC 904 can be integrated within the beamformer 902 instead of outside the PMIC 904 as shown in the MCM 800 as described with reference to FIG. 8. The PMIC 904 can be the same as or similar to the PMICs as described with reference to FIGS. 3-7.

Referring generally to FIGS. 8-9, multiple MCMs similar to MCM 800 or MCM 900 can provide fault tolerant operation and easy building and testing of phased array systems. Since if any one PMIC fails, only that MCM will fail and the other MCMs can continue to operate properly, i.e., the phased array system has soft failure capabilities since only a single cell of the phased array system would fail and the remainder of the array can continue to operate. In some cases, 10-20% of cells can fail but the phased array system can continue to operate. Furthermore, design and testing can be improved since a number of cells for the phased array system is modular and does not depend on designing or redesigning power supplies.

The MCM of FIG. 9 can provide the highest level of integration possible and the ability to share information between the beamformer 902 and the PMIC 904. The MCM of FIG. 9 may also realize the lowest amount of resource consumption and lowest reoccurring cost to manufacture and smallest area consumption. The MCM of FIG. 8 can realize the potential to reuse existing beamformer designs and does not require a redesign to accommodate the incorporation of the PMIC. Furthermore, designing MCMs such as the MCM 800 may not require for the PMIC and beamformer to be designed together, decoupling dependencies in design.

Figure 10:
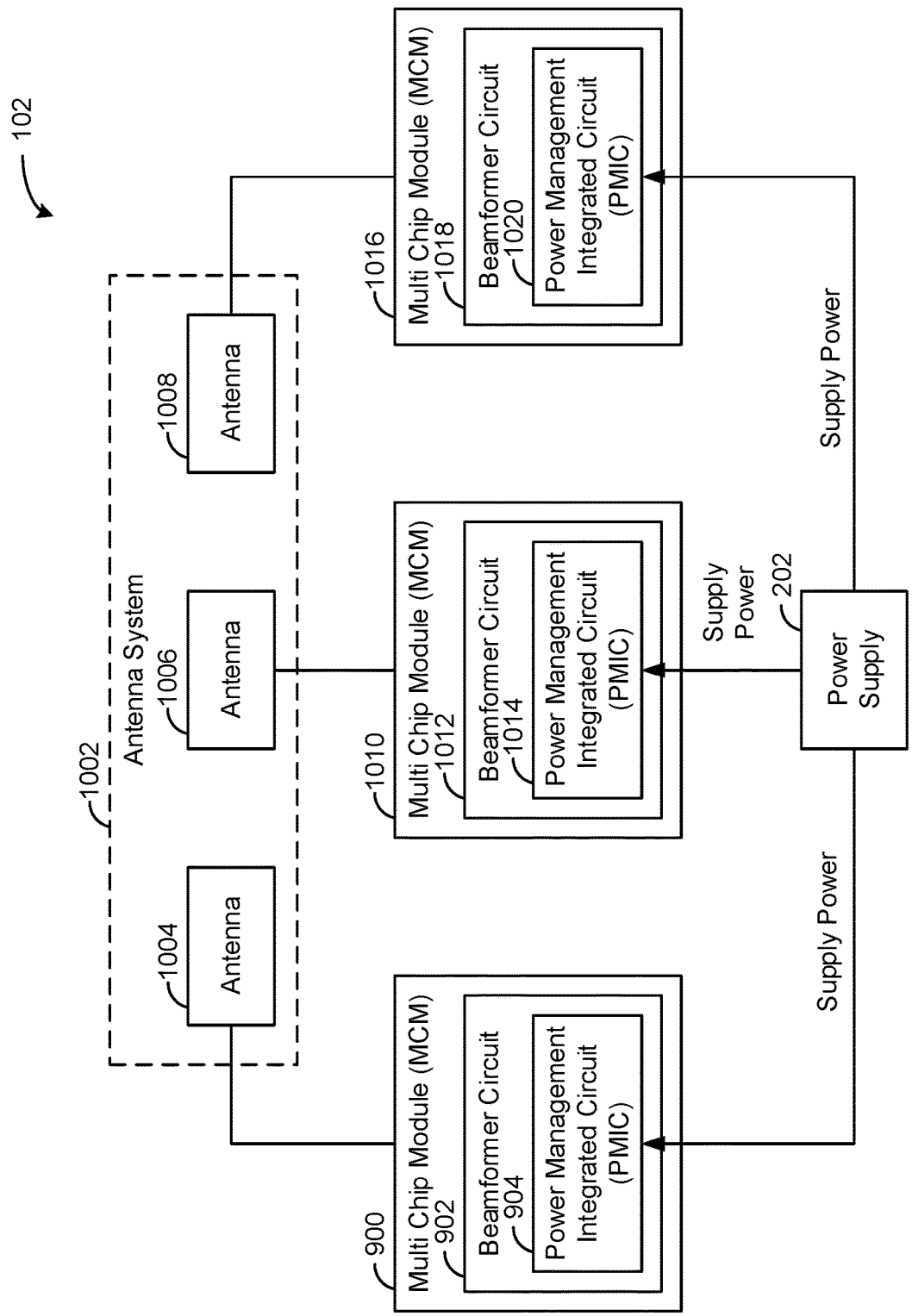
FIG. 10 is a circuit block diagram of the phased array system of FIG. 1 shown in greater detail to include PMICs integrated with beamformer circuits, according to exemplary aspects of the inventive concepts disclosed herein.
Figure 11:
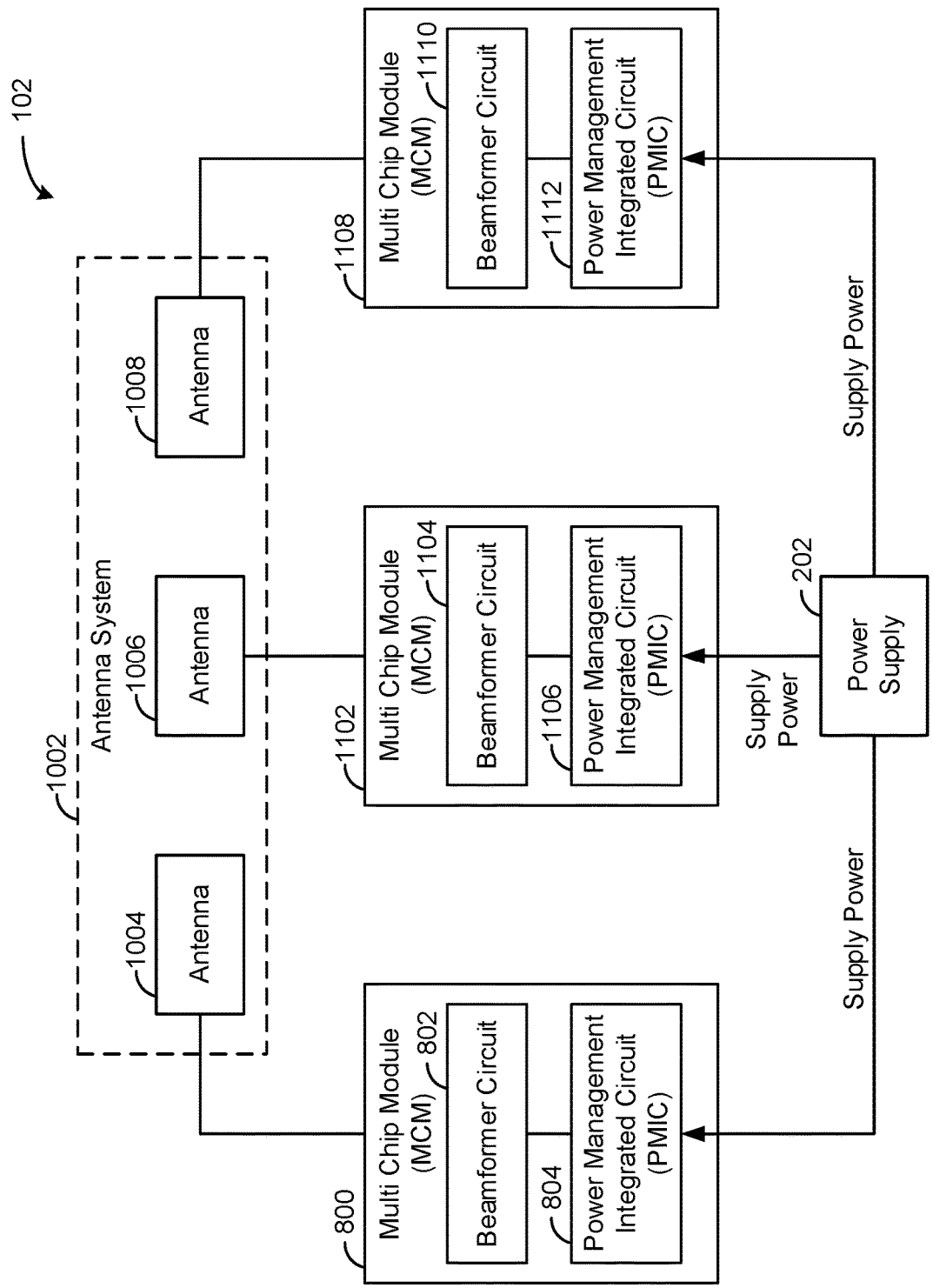
FIG. 11 is a circuit block diagram of the phased array of FIG. 1 shown in greater detail to include PMICs communicating with beamformer circuits, according to exemplary aspects of the inventive concepts disclosed herein.

Referring now to FIGS. 10-11, the phased array system 102 is shown in greater detail including MCMs similar to the MCM 800 as described with reference to FIG. 8 and MCMs similar to the MCM 900 as described with reference to FIG. 9. Referring more particularly to FIG. 10, the phased array system 102 is shown to include an antenna system 1002. The antenna system 1002 can include multiple antennas ordered in a matrix. For illustrative purposes, three antennas 1004-1008 are shown configured to transmit or receive signals although any number of individual antennas can be included in the antenna system 1002. As shown in FIG. 10 each antenna is associated with a particular unit cell, e.g., MCM 900, MCM 1010 including beamformer circuit 1012 with an integrated PMIC 1014, and MCM 1016 with a beamformer circuit 1018 with an integrated PMIC 1020. Similarly, in FIG. 11, each of the antenna 1004 are associated with (controlled to send or receive by) the MCM 800, MCM 1102 including beamformer circuit 1104 and PMIC 1106, and MCM 1108 including beamformer circuit 1110 and PMIC 1112.

The scope of this disclosure should be determined by the claims, their legal equivalents and the fact that it fully encompasses other embodiments which may become apparent to those skilled in the art. All structural, electrical and functional equivalents to the elements of the above-described disclosure that are known to those of ordinary skill in the art are expressly incorporated herein by reference and are intended to be encompassed by the present claims. A reference to an element in the singular is not intended to mean one and only one, unless explicitly so stated, but rather it should be construed to mean at least one. No claim element herein is to be construed under the provisions of 35 U.S.C. § 112, sixth paragraph, unless the element is expressly recited using the phrase "means for." Furthermore, no element, component or method step in the present disclosure is intended to be dedicated to the public, regardless of whether the element, component or method step is explicitly recited in the claims.

Embodiments of the inventive concepts disclosed herein have been described with reference to drawings. The drawings illustrate certain details of specific embodiments that implement the systems and methods and programs of the present disclosure. However, describing the embodiments with drawings should not be construed as imposing any limitations that may be present in the drawings. The present disclosure contemplates methods, systems and program products on any machine-readable media for accomplishing its operations. Embodiments of the inventive concepts disclosed herein may be implemented using an existing computer processor, or by a special purpose computer processor incorporated for this or another purpose or by a hardwired system.

Embodiments in the inventive concepts disclosed herein have been described in the general context of method steps which may be implemented in one embodiment by a program product including machine-executable instructions, such as program code, for example in the form of program modules executed by machines in networked environments. Generally, program modules include routines, programs, objects, components, data structures, etc. that perform particular tasks or implement particular abstract data types. Machine-executable instructions, associated data structures, and program modules represent examples of program code for executing steps of the methods disclosed herein. The particular sequence of such executable instructions or associated data structures represent examples of corresponding acts for implementing the functions described in such steps.

It should be noted that although the diagrams herein may show a specific order and composition of method steps, it is understood that the order of these steps may differ from what is depicted. For example, two or more steps may be performed concurrently or with partial concurrence. Also, some method steps that are performed as discrete steps may be combined, steps being performed as a combined step may be separated into discrete steps, the sequence of certain processes may be reversed or otherwise varied, and the nature or number of discrete processes may be altered or varied. The order or sequence of any element or apparatus may be varied or substituted according to alternative embodiments. Accordingly, all such modifications are intended to be included within the scope of the present disclosure.

The foregoing description of embodiments has been presented for purposes of illustration and description. It is not intended to be exhaustive or to limit the subject matter to the precise form disclosed, and modifications and variations are possible in light of the above teachings or may be acquired from practice of the subject matter disclosed herein. The embodiments were chosen and described in order to explain the principals of the disclosed subject matter and its practical application to enable one skilled in the art to utilize the disclosed subject matter in various embodiments and with various modifications as are suited to the particular use contemplated. Other substitutions, modifications, changes and omissions may be made in the design, operating conditions and arrangement of the embodiments without departing from the scope of the presently disclosed subject matter.

What is claimed is:

1. A phased array system, the phased array system comprising:
    an antenna system comprising a plurality of antennas configured to transmit or receive signals;
    a power supply circuit configured to generate a supply power and provide the supply power to a plurality of distributed power supply circuits;
    the plurality of distributed power supply circuits, each of the plurality of distributed power supply circuits configured to receive the supply power from the power supply circuit and generate a plurality of radio frequency supply powers for one of a plurality of radio frequency circuits; and
    the plurality of radio frequency circuits, each of the plurality of radio frequency circuits configured to cause one of the plurality of antennas to transmit or receive the signals based on the plurality of radio frequency supply powers.

2. The phased array system of claim 1, wherein each of the radio frequency circuits is a time varying load on one of the plurality of distributed power supply circuits;
    wherein the one of the plurality of distributed power supply circuits adjusts a voltage level of at least one of the plurality of radio frequency supply powers that the one of the plurality of distributed power supply circuits is configured to generate based on the changing load.

3. The phased array system of claim 1, wherein each of the plurality of distributed power supply circuits comprise a plurality of switching circuits configured to open and close to generate one of the plurality of radio frequency supply powers;
    wherein the plurality of distributed power supply circuits reduce emissions generated by the phased array system by opening or closing a predefined number of the plurality of switching circuits at the same time.

4. The phased array system of claim 3, wherein each of the plurality of distributed power supply circuits detects whether the distributed power supply circuit has failed and operates a switch of the plurality of switching circuits to cause an open circuit with the power supply in response to a detection that the distributed power supply circuit has failed.

5. The phased array system of claim 1, wherein each of the plurality of radio frequency circuits are integrated circuits, wherein each of the integrated circuits includes one of the plurality of distributed power supply circuits within the integrated circuit.

6. The phased array system of claim 1, wherein a first radio frequency circuit of the plurality of radio frequency circuits is configured to transmit a first signal;
   wherein a second radio frequency circuit of the plurality of radio frequency circuits is configured to transmit a second signal;
   wherein a first distributed power supply of the plurality of distributed power supplies is configured to control a level of a first power supply voltage based on an envelope of the first signal;
   wherein a second distributed power supply of the plurality of distributed power supplies is configured to control a level of a second power supply voltage based on an envelope of the second signal;
   wherein the level of the first power supply voltage is controlled separately from the level of the second power supply voltage.

7. The phased array system of claim 1, wherein each of the distributed power supply circuits locally performs power on or power off sequencing for one of the plurality of radio frequency circuits.

8. The phased array system of claim 1, wherein the phased array system further comprises a plurality of multi-chip-modules, wherein one of the plurality of radio frequency circuits and one of the distributed power supply circuits are located in each of the multi-chip-modules.

9. The phased array system of claim 8, wherein the one of the plurality of radio frequency circuits and the one of the radio frequency circuits are configured to communicate via a communication protocol.

10. The phased array system of claim 9, wherein each of the plurality of distributed power supply circuits controls a voltage level of the plurality of supply powers based on the communication, wherein the communication is indicative of a load of at least one of the radio frequency circuits.

11. A power supply system for a phased array system, the power supply system comprising:
   a power supply circuit configured to generate a supply power and provide the supply power to a plurality of distributed power supply circuits; and
   the plurality of distributed power supply circuits, each of the plurality of distributed power supply circuits configured to receive the supply power from the power supply circuit and generate a plurality of radio frequency supply powers for one of a plurality of radio frequency circuits of the phased array system.

12. The power supply system of claim 11, wherein each of the radio frequency circuits is a time varying load on one of the plurality of distributed power supply circuits;
   wherein the one of the plurality of distributed power supply circuits adjusts a voltage level of at least one of the plurality of radio frequency supply powers that the one of the plurality of distributed power supply circuits is configured to generate based on the time varying load.

13. The power supply system of claim 11, wherein each of the plurality of distributed power supply circuits comprise a plurality of switching circuits configured to open and close to generate one of the plurality of radio frequency supply powers;
   wherein the plurality of distributed power supply circuits reduce emissions generated by the phased array system by opening or closing a predefined number of the plurality of switching circuits at the same time.

14. The power supply system of claim 11, wherein each of the plurality of distributed power supply circuits detect whether the distributed power supply circuit has failed and operate a switch to cause an open circuit with the power supply in response to a detection that the distributed power supply circuit has failed.

15. The power supply system of claim 11, wherein each of the plurality of radio frequency circuits are integrated circuits, wherein each of the integrated circuits includes one of the plurality of distributed power supply circuits within the integrated circuit.

16. The power supply system of claim 11, wherein a first radio frequency circuit of the plurality of radio frequency circuits is configured to transmit a first signal;
   wherein a second radio frequency circuit of the plurality of radio frequency circuits is configured to transmit a second signal;
   wherein a first distributed power supply of the plurality of distributed power supplies is configured to control a level of a first power supply voltage based on an envelope of the first signal;
   wherein a second distributed power supply of the plurality of distributed power supplies is configured to control a level of a second power supply voltage based on an envelope of the second signal;
   wherein the level of the first power supply voltage is controlled separately from the level of the second power supply voltage.

17. The power supply system of claim 11, wherein the phased array system further comprises a plurality of substrates, wherein one of the plurality of radio frequency circuits and one of the distributed power supply circuits are located on each of the plurality of substrates;
   wherein the one of the plurality of radio frequency circuits and the one of the radio frequency circuits are configured to communicate via a communication protocol.

18. The power supply system of claim 17, wherein each of the plurality of distributed power supply circuits are configured to control a voltage level of the plurality of supply powers based on the communication, wherein the communication is indicative of a load of at least one of the radio frequency circuits.

19. An multi-chip-module for a phased array system, the multi-chip-module comprising:
   a distributed power supply circuit, the distributed power supply circuit configured to receive a supply power from a power supply circuit and generate a plurality of radio frequency supply powers for a radio frequency circuit of the multi-chip-module; and
   the radio frequency circuit, the radio frequency circuit configured to cause an antenna to transmit or receive a signal based on the plurality of radio frequency supply powers.

20. The multi-chip-module of claim 19, wherein the distributed power supply circuit and the radio frequency circuit are combined within a single integrated circuit.

* * * * *